United States Patent
Hara et al.

(10) Patent No.: US 8,331,063 B2
(45) Date of Patent: *Dec. 11, 2012

(54) MAGNETORESISTIVE EFFECT ELEMENT IN CPP-TYPE STRUCTURE AND MAGNETIC DISK DEVICE

(75) Inventors: Shinji Hara, Tokyo (JP); Tsutomu Chou, Tokyo (JP); Yoshihiro Tsuchiya, Tokyo (JP); Hironobu Matsuzawa, Tokyo (JP)

(73) Assignee: TDK Corporation, Tokyo (JP)

( * ) Notice: Subject to any disclaimer, the term of this patent is extended or adjusted under 35 U.S.C. 154(b) by 629 days.

This patent is subject to a terminal disclaimer.

(21) Appl. No.: 12/500,907

(22) Filed: Jul. 10, 2009

(65) Prior Publication Data

US 2011/0007421 A1 Jan. 13, 2011

(51) Int. Cl.
*G11B 5/39* (2006.01)
(52) U.S. Cl. .................................. 360/324.12
(58) Field of Classification Search ........ 360/324–324.2
See application file for complete search history.

(56) References Cited

U.S. PATENT DOCUMENTS

| 8,154,828 B2* | 4/2012 | Tsuchiya et al. | 360/324.12 |
| 2006/0291105 A1* | 12/2006 | Chang et al. | 360/324.2 |
| 2008/0253174 A1* | 10/2008 | Yoshikawa et al. | 365/158 |
| 2008/0278864 A1* | 11/2008 | Zhang et al. | 360/324.12 |
| 2008/0291585 A1* | 11/2008 | Yoshikawa et al. | 360/324.11 |
| 2009/0080122 A1* | 3/2009 | Freitag et al. | 360/324.1 |

FOREIGN PATENT DOCUMENTS

| JP | A-2008-34523 | 2/2008 |
| JP | A-2008-91842 | 4/2008 |
| JP | A-2009-27177 | 2/2009 |

OTHER PUBLICATIONS

Yuasa et al., "Giant room-temperature magnetoresistance in single-crystal Fe/MgO/Fe magnetic tunnel junctions," Nature Materials, vol. 3, Dec. 2004, pp. 868-871.*
Yuasa, "Giant tunneling magnetoresistance up to 410% at room temperature in fully epitaxial Co/MgO/Co magnetic tunnel junctions with bcc Co(001) electrodes," Applied Physics Letters 89, 042505 (2006); pp. 042505-1 through 042505-03.*
Notice of Allowance mailed on Dec. 12, 2011 from the U.S. Patent Office in related U.S. Appl. No. 12/500,835.
U.S. Appl. No. 12/500,835, filed Jul. 10, 2009, Tsuchiya et al.

* cited by examiner

*Primary Examiner* — Will J Klimowicz
(74) *Attorney, Agent, or Firm* — Posz Law Group, PLC

(57) ABSTRACT

An MR element in a CPP-GMR structure includes a first ferromagnetic layer, a spacer layer that is epitaxially formed on the first ferromagnetic layer, a second ferromagnetic layer that is located on the spacer layer, and that is laminated with the first ferromagnetic layer to sandwich the spacer layer. A sense current flows along a lamination direction of the first and second ferromagnetic layers. Angle of magnetization directions of the first ferromagnetic layer and the second ferromagnetic layer relatively change due to an externally applied magnetic field.

13 Claims, 6 Drawing Sheets

MAGNETORESISTIVE EFFECT ELEMENT IN CPP-TYPE STRUCTURE AND MAGNETIC DISK DEVICE

CROSS REFERENCE TO RELATED APPLICATION

This application is related to U.S. application Ser. No. 12/500,835, entitled "MAGNETORESISTIVE EFFECT ELEMENT IN CPP-TYPE STRUCTURE AND MAGNETIC DISK DEVICE," filed on Jul. 10, 2009.

BACKGROUND OF THE INVENTION

1. Field of the Invention

The present invention relates to a magnetoresistive effect element (MR element) in a CPP-type structure that detects magnetic field intensity as a signal from a magnetic recording medium, and so on, a thin film magnetic head with the MR element, and a head gimbal assembly and a magnetic disk device that have the thin film magnetic head.

2. Description of Related Art

In recent years, with an increase in the high recording density of a magnetic disk drive (HDD), there have been growing demands for improvements in the performance of a thin film magnetic head. For a thin film magnetic head, a composite type thin film magnetic head has been widely used; it has a structure where a reproducing head having a read-only magnetoresistive effect element (hereinafter, magneto-resistive (MR) element), and a recording head having a write-only induction type magnetic conversion element are laminated together.

Generally, a shield layer is formed in a reproducing head to restrict an area of a medium that interferes with a reproducing element. Currently, in a conventional head structure, a first shield film, a second shield film and an MR element are connected in series without an intershield insulating layer. This structure is referred to as an MR element in a current perpendicular to plane type (CPP) structure. In consideration of the efficiency of heat dissipation and maintenance of an output, and so on, a CPP-type structure is essential to realizing a high recording density beyond 500 Gbits/in$^2$.

A general CPP-type element with a spin valve is briefly explained below. A typical spin valve CPP-type element is formed by a lamination structure for its main layers as follows: a lower electrode layer/an under layer/an antiferromagnetic layer/a ferromagnetic layer (1)/a spacer layer/a ferromagnetic layer (2)/a cap layer/an upper electrode layer. The top most layer is the upper electrode layer, and the bottom most layer is the lower electrode layer. In the specification, a lamination layer may be described as having the above format.

A magnetization direction of the ferromagnetic layer (1), which is one of the ferromagnetic layers, is pinned in the perpendicular direction to a magnetization direction of the ferromagnetic layer (2) when the externally applied magnetic field is zero. The ferromagnetic layer (2) is generally referred to as a magnetic free layer. The magnetization direction of the ferromagnetic layer (1) can be pinned by making an antiferromagnetic layer adjacent thereto and providing unidirectional anisotropic energy (also referred to as "exchange bias" or "coupling magnetic field") to the ferromagnetic layer (1) by means of exchange-coupling between the antiferromagnetic layer and the ferromagnetic layer (1). For this reason, the ferromagnetic layer (1) is also referred to as a magnetic pinned layer.

As mentioned above, a CPP-type element that is configured with a connection between a shield layer and an MR element through a metal is advantageous because it increases heat dissipation efficiency and operating current. In this CPP element, a smaller cross sectional area of an element has a larger resistance value and a larger resistance variation. Namely, it is an appropriate structure for a so called narrower track width. A narrower track width increases the number of tracks per inch (TPI), and it is an essential technology for increasing the recording density of a hard disk drive (HDD).

However, in view of the high frequency characteristic of the above CPP element, an increase in the resistance of such an element is undesirable. Therefore, research and development has been performed to develop a CPP-GMR element that has a spacer layer made of a low resistance material instead of having a tunneling magnetoresistance (TMR) element with a barrier that has a high resistance value.

As an example of a practical CPP-GMR element, there is a spin-valve type CPP-GMR element that is configured with the following layers in a bottom up direction: a lower electrode, a PdPtMn antiferromagnetic film, a magnetic pinned layer (pinned layer) of which a magnetization direction is pinned with respect to the antiferromagnetic film and which is configured with a CoFeB film, a spacer layer configured with a Cu film, a magnetic free layer (free layer) of which a magnetization direction varies depending on an externally applied magnetic field and which is configured with a CoFeB layer, and an upper electrode. A magnetoresistive ratio (hereinafter "MR ratio") of this element is about 1.16% in a single spin-valve structure. This MR ratio is not large enough to generate appropriate output power in view of practical applications. This is because when a practical application of a head with an areal density beyond 600 Gbpsi is considered, the S/N (signal to noise ratio) ratio improves as the MR ratio increases. Meanwhile, with respect to a dual spin-valve structure that has a relatively large MR ratio, such a structure does not satisfy the demand for a narrower read gap because a total layer thickness of a spin-valve is large.

As one instrument for improving an MR ratio of a CPP-GMR element, a so-called current confined path (CCP) CPP-GMR element has been proposed. This structure controls the flow of a sense current so that an effect of the spin-dependent scattering associated with a material is utilized to a maximum extent. When this structure is used, the MR ratio is improved. In Japanese patent number 3293437, a technology for enhancing a GMR effect by using a CCP structure is described as a spacer layer.

In Japanese laid-open patent publication number 2003-204094, a technology providing an insulating material distributed along the interface in a spacer layer for realizing a CCP-CPP-GMR element is disclosed. For example, the spacer layer is configured with a Cu/nano oxide layer (NOL)/Cu structure.

In Japanese laid-open patent publication no. 2002-208744, a technology providing a "resistance adjustment layer" along an interface of a magnetic pinned layer magnetic free layer or a spacer layer is disclosed. The resistance adjustment layer is defined as a layer configured by mixing a conductive layer and an insulating layer that has an aperture ratio of 50% or lower by pinholes. A specific structure of the resistance adjustment layer is configured with two or more kinds of metals (for example, AlCu) in which one metal is preferably oxidized through an oxidation treatment.

It is possible to increase an MR ratio because the resistivity of a CPP-type element can be increased to a high level through the technologies discussed above. However, these technologies can be unreliable. Since a current confined path is an essential part of these technologies, and a current is concentrated at a current confined path of an electrically conductive part so that the current density of the electrically conductive part is increased, local migration occurs.

In consideration of the situation mentioned above, a group of members including inventors of the present invention has focused on use of a semiconductor material, such as ZnO, $In_2O_3$, and $SnO_2$, as a nonmagnetic intermediate layer of a CPP-GMR element. The group determined that a CPP-GMR element made of such semiconductor materials has a high MR ratio (see Japanese laid-open patent publication numbers 2008-91842 and 2008-205438).

However, in consideration of future applications with high density recording of 2 T bpsi or more, it is predicted that an MR element, which has an MR ratio of 50% or greater when an area resistivity (AR) of the MR element is equal to 0.2 $\Omega cm$, will be required based on a calculation of a S/N ratio. However, an MR ratio of a currently reported CPP-GMR element is still relatively low. Therefore, there is a need for development of an element structure that further improves an MR ratio.

In consideration of the situation described above, the present invention is provided. An object of the present invention is to provide a novel MR element enabling further improvements of an MR ratio and inhibiting an increase of an area resistivity (AR) to enable the MR element to be used for future high density recording applications requiring 2 T bpsi or more. It is also an object to provide a thin film magnetic head that has the MR element mentioned above, and a head gimbal assembly and a magnetic disk device that have the thin film magnetic head mentioned above.

SUMMARY OF THE INVENTION

In order to solve the above drawbacks, a magnetoresistive effect element (MR element) that is a giant magnetoresistive effect element in a current perpendicular to plane (CPP-GMR) structure includes a spacer layer, a first ferromagnetic layer and a second ferromagnetic layer that are laminated to sandwich the spacer layer, in which a sense current flows along a lamination direction of the first and second ferromagnetic layers. The first ferromagnetic layer is formed before the second ferromagnetic layer, and is located below the second ferromagnetic layer, an angle of magnetization directions of the first ferromagnetic layer and the second ferromagnetic layer relatively change due to an externally applied magnetic field, the spacer layer is configured with a semiconductor layer, and the spacer layer is formed on the first ferromagnetic layer under the condition of the epitaxial growth.

As a preferred embodiment of the present invention, a crystal structure of the semiconductor layer is a cubical crystal.

As a preferred embodiment of the present invention, a crystal structure of the semiconductor layer is configured with a zincblende structure or a NaCl type structure (rock salt type structure).

As a preferred embodiment of the present invention, the first ferromagnetic layer and the semiconductor layer are formed in a (001) orientation.

As a preferred embodiment of the present invention, a lattice mismatch between the first ferromagnetic layer and the semiconductor layer is less than 10%.

As a preferred embodiment of the present invention, the first ferromagnetic layer is made of one of CoFe, $Fe_4N$, and a Heusler alloy.

As a preferred embodiment of the present invention, a NiFeN orientation under layer having a (001) orientation is formed below the first ferromagnetic layer, the first ferromagnetic layer is formed on the NiFeN orientation under layer under the condition of the epitaxial growth, and the spacer layer is formed on the first ferromagnetic layer under the condition of the epitaxial growth.

As a preferred embodiment of the present invention, the second ferromagnetic layer is in a (001) orientation, and the second ferromagnetic layer is formed on the spacer layer under the condition of the epitaxial growth.

As a preferred embodiment of the present invention, a lattice mismatch between the semiconductor layer and the second ferromagnetic layer is less than 10%.

As a preferred embodiment of the present invention, the second ferromagnetic layer is made of one of CoFe, $Fe_4N$, and a Heusler alloy.

As a preferred embodiment of the present invention, a nonmagnetic layer, which does not obstruct a spin conveyance, is inserted between the first ferromagnetic layer and the semiconductor layer and/or between the second ferromagnetic layer and the semiconductor layer.

A thin film magnetic head of the present invention includes an air bearing surface (ABS) that is opposite to a recording medium, the magnetoresistive effect element (MR element) described above that is provided in the vicinity of the ABS to detect a signal magnetic field from the recording medium, and a pair of electrodes that apply an electric current in a lamination direction of the MR element.

A head gimbal assembly of the present invention includes a slider having the thin film magnetic head described above and being provided opposite to a recording medium, and a suspension elastically supporting the slider.

A magnetic disk device of the present invention includes a slider having the thin film magnetic head described above and being provided opposite to a recording medium, and a positioning device supporting the slider and locating a position of the slider with respect to the recording medium.

BRIEF DESCRIPTION OF THE DRAWINGS

FIG. 2 is a sectional view of a thin film magnetic head that is perpendicular to an ABS and a substrate according to one embodiment of the present invention.

DETAILED DESCRIPTION

The best mode for implementing the present invention will be described in detail hereafter.

Figure 1:
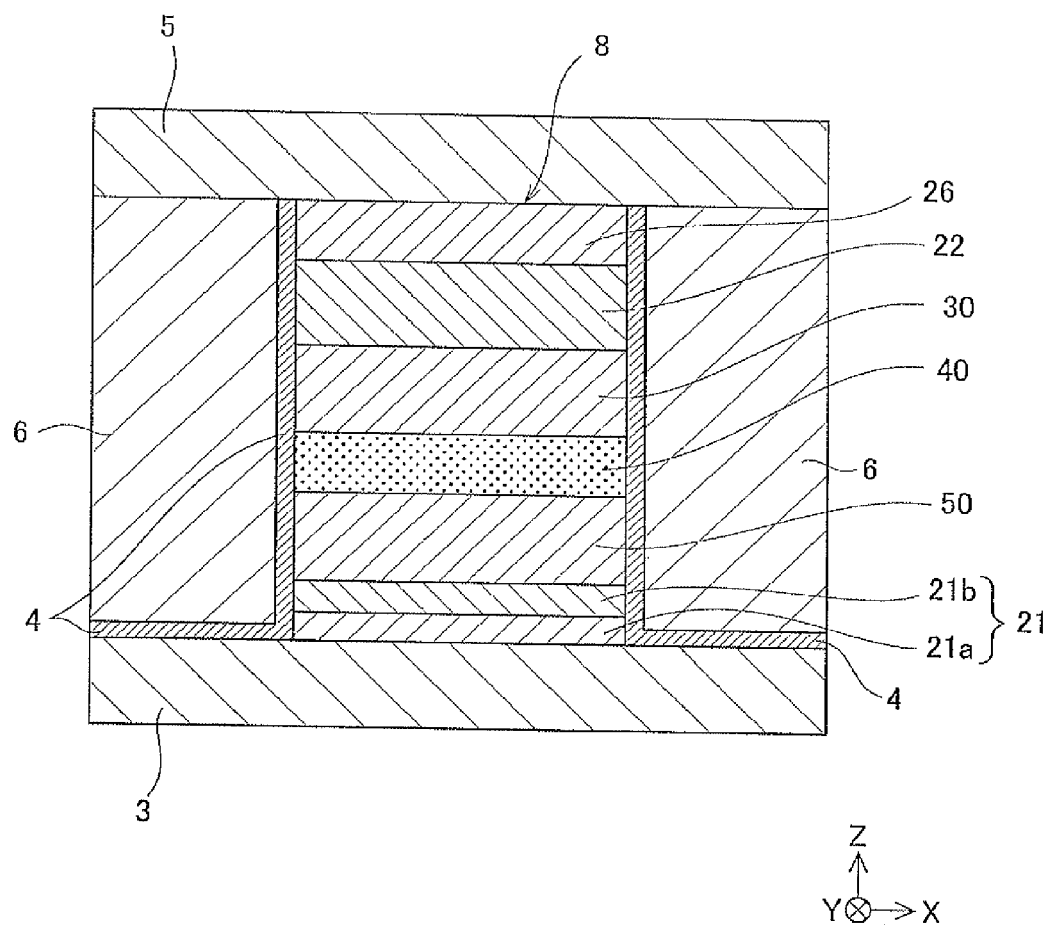
FIG. 1 is a sectional view of a reproducing head that is parallel to an opposing medium surface (or air bearing surface, hereinafter collectively ABS) of a recording medium according to one embodiment of the present invention.

FIG. 1 is a schematic view of an air bearing surface (ABS) of a reproducing head according to one embodiment of the present invention. Specifically, it shows the ABS of a giant magnetoresistive effect element in a CPP-type structure (CPP-GMR element), which is a main part of the present invention. The ABS generally corresponds to a surface at which a reproducing head is in opposition to a recording medium (hereinafter often called the opposing medium surface or ABS); however, it is understood that the ABS of the present invention includes not only the surface but also a section where a lamination structure of the element can be clearly observed. For instance, a passivation layer of diamond-like carbon (DLC) or the like (the passivation layer adapted to cover the element), in a strict sense, positioned at the ABS may be omitted if necessary.

Figure 2:
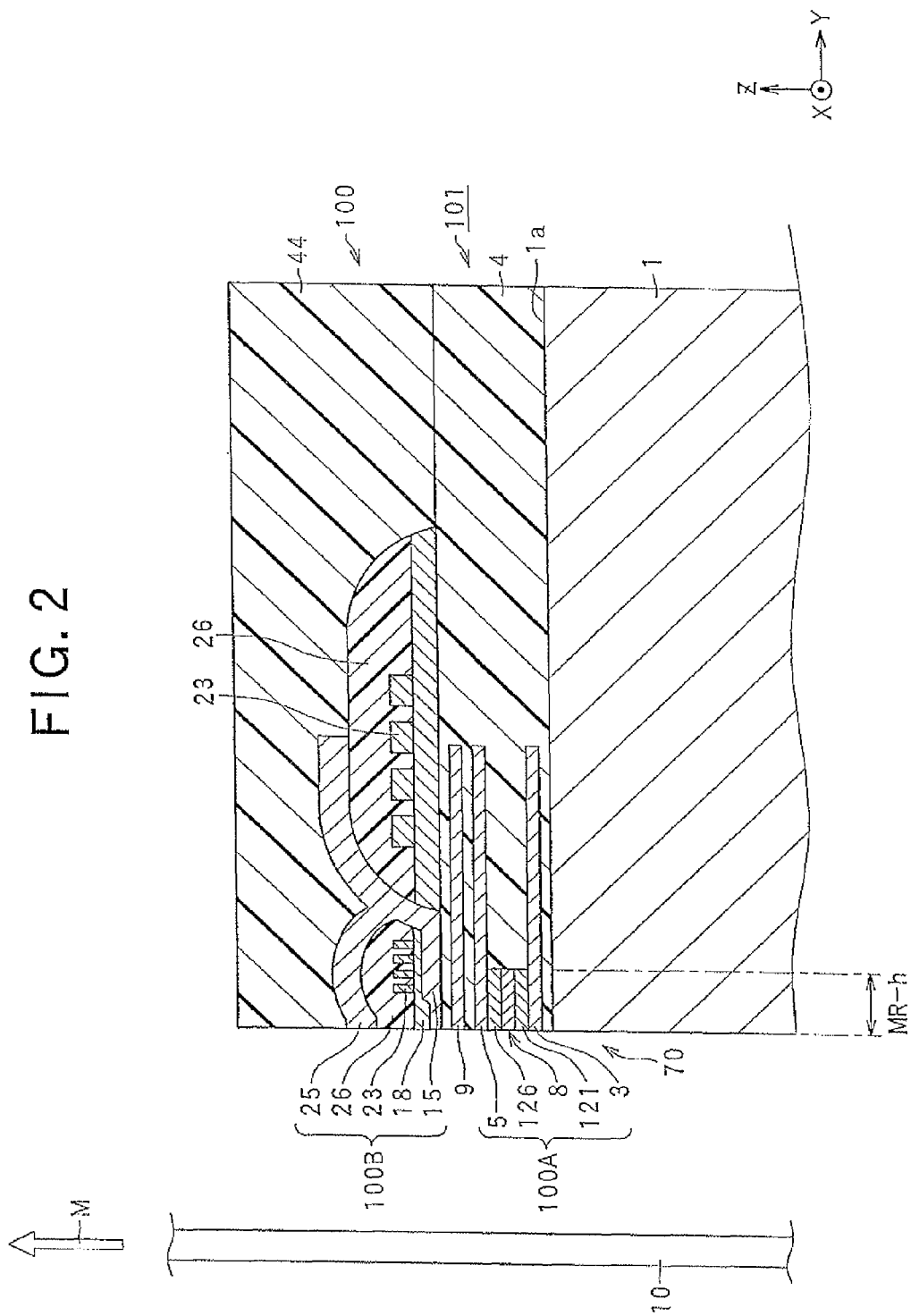
FIG. 2 is a view for explaining the structure of the thin film magnetic device. Particularly.

FIG. 2 is a sectional view of a thin film magnetic head that is perpendicular to an ABS and a substrate according to one embodiment of the present invention, for explaining the structure of the thin film magnetic head.

Figure 3:
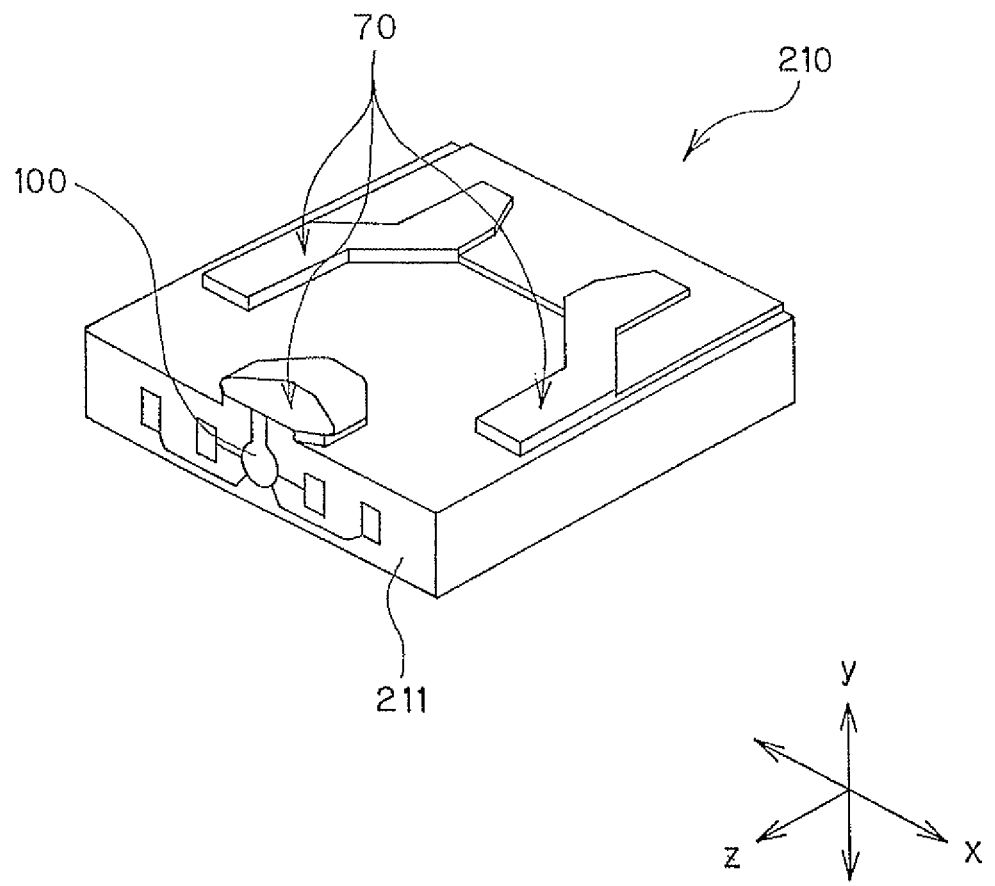
FIG. 3 is a perspective view of a slider that is a part of a head gimbal assembly according to one embodiment of the present invention.
Figure 4:
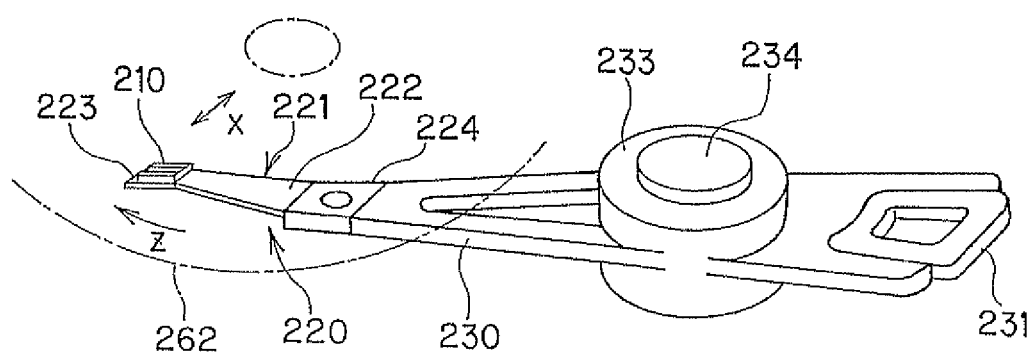
FIG. 4 is a perspective view of a head arm assembly that contains a head gimbal assembly according to one embodiment of the present invention.
Figure 5:
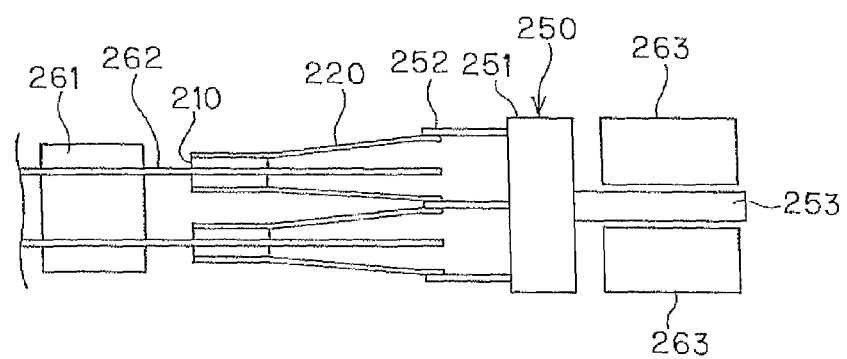
FIG. 5 is an illustration for explaining primary parts of a magnetic disk device according to one embodiment of the present invention.
Figure 6:
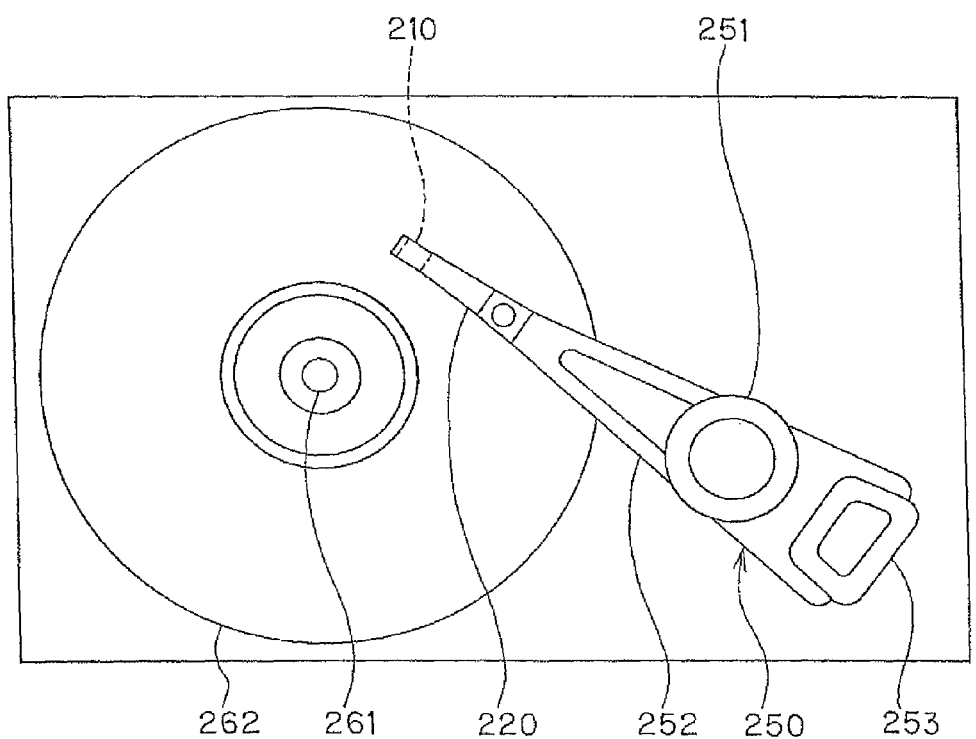
FIG. 6 is a top plan view of a magnetic disk device according to one embodiment of the present invention.

FIG. 3 is a perspective view of a slider that is a part of a head gimbal assembly according to one embodiment of the present invention. FIG. 4 is a perspective view of a head arm assembly that contains a head gimbal assembly according to one embodiment of the present invention. FIG. 5 is an illustration for explaining primary parts of a magnetic disk device according to one embodiment of the present invention. FIG. 6 is a top plan view of a magnetic disk device according to one embodiment of the present invention.

In the explanation below, the X axis is defined as "width," the Y axis is defined as "length," and the Z axis is defined as "thickness" in each drawing. In the Y axis direction, an area that is close to an ABS (hereinafter, referred as an opposing medium surface) is defined as "front," and an area that is opposite side of the front is defined as "rear (or posterior)." The laminated up direction of an element is defined as "above" or "upper side," and the opposite direction is defined as "below" or "lower side."

[GMR Element in CPP-Type Structure (CPP-GMR Element)]

A detailed description of a structure of a reproducing head of a giant magnetoresistive effect element in a CPP-type structure (CPP-GMR element) according to the present invention is given below with reference to FIG. 1.

As described above, FIG. 1 is a sectional view corresponding to a section of a reproducing head parallel to an ABS.

As shown in FIG. 1, the reproducing head according to the present embodiment includes a first shield layer 3 and a second shield layer 5 that are spaced apart and opposed to each other in a thickness direction, a giant magnetoresistive effect element 8 (hereinafter referred simply to as "GMR element") interposed between the first shield layer 3 and the second shield layer 5, an insulating film 4 adapted to cover two sides of the GMR element 8 and a part of the upper surface of the first shield layer 3 along those sides, and two bias magnetic field application layers 6 adjacent to the two sides of the GMR element 8 through the insulating film 4.

In this embodiment, the first shield layer 3 and the second shield layer 5 function both as a magnetic shield and as a pair of electrodes. In other words, they not only shield magnetism but also enable a sense current to flow in a direction intersecting the plane of each of the layers forming the GMR element 8 such as, for instance, in a direction perpendicular to the plane of each of the layers forming the GMR element 8 (lamination direction). For this reason, the first shield layer 3 and the second shield layer 5 may be referred to as a "lower electrode layer 3" and an "upper electrode layer 5," respectively.

In addition to the first shield layer 3 and the second shield layer 5, another pair of electrodes may be provided above and below the GMR element 8.

A reproducing head according to the present invention includes the GMR element 8 as a main part in a CPP-type structure.

The GMR element 8 in a CPP-type structure as shown in FIG. 1 has a spacer layer 40, and a first ferromagnetic layer 50 and a second ferromagnetic pinned layer 30, which are laminated to sandwich the spacer layer 40.

The first ferromagnetic layer 50 is formed before the second ferromagnetic layer 30 is formed and is a layer provided in a lower part of the structure. Angle of magnetization directions of the first ferromagnetic layer 50 and the second ferromagnetic layer 30 relatively change due to an externally applied magnetic field.

With respect to the first ferromagnetic layer 50 and the second ferromagnetic layer 30, they may have the following structure: (1) when either one of the ferromagnetic layers 50, 30 is magnetically pinned, the relative angle of the magnetization directions change due to an externally applied magnetic field, or (2) when the both ferromagnetic layers 50, 30 are free layers, both angle of magnetization directions relatively change due to an externally applied magnetic field.

In a preferred embodiment shown in FIG. 1, the second ferromagnetic layer 30 located in an upper part of the structure is magnetically pinned and acts as a magnetic pinned layer 30; and the first ferromagnetic layer 50 located in a lower part of the structure acts as a free layer 50. As a sense current flows in a lamination direction of the GMR element 8, it causes the GMR element 8 to become operative in the current perpendicular to plane (CPP) type structure.

As discussed above, a magnetization direction of the free layer 50 changes due to an externally applied magnetic field, i.e., a signal magnetic field from a recording medium; and a magnetization direction of the magnetic pinned layer 30 is pinned due to an influence from an antiferromagnetic layer 22. In FIG. 1, the magnetic pinned layer 30 is formed in an upper part of the structure relative to the free layer 50. Therefore, the antiferromagnetic layer 22 is formed in an upper part relative to the magnetic pinned layer 30. This structure in the embodiment is referred to as a top-type structure.

A cap layer 26 is formed on the antiferromagnetic layer 22.

An under layer 21 is formed below the free layer 50. The preferred under layer 21 shown in FIG. 1 is configured with a two-layer structure including an orientation under layer 21b and a base under layer 21a.

A detailed explanation of each structure is given below.

[Explanation of Free Layer 50 as First Ferromagnetic Layer]

The free layer 50 is a layer of which a magnetization direction varies depending on an externally applied magnetic field, i.e., a signal magnetic field from a recording medium and is configured with a ferromagnetic layer with a low coercive force (soft magnetic layer).

Preferred materials for the free layer 50 are CoFe, $Fe_4N$, and Heusler alloys, such as CoMnSi, CoFeSi, CoCrFeSi, CoMnGe, CoFeAlSi, CoFeMnSi, or CoMnSn.

It is necessary that the free layer 50 is formed with a (001) crystal plane orientation toward a lamination direction (hereinafter, "(001) crystal plane orientation" may be referred to as "(001) plane orientation" or "(001) orientation"). For example, the free layer 50 may be made of CoFe, which has a (001) orientation, with a BCC structure, or of a Heusler alloy, which has a (001) orientation, with a BCC structure.

The free layer 50 has a thickness of, for example, approximately 2 to 10 nm. The free layer 50 can be configured with a single layer structure. The free layer 50 may also be a multiple-layer structure including laminated several ferromagnetic layers as far as they do not depart from the effect of the present invention.

[Explanation of Spacer Layer 40]

The spacer layer 40 is basically configured with a semiconductor layer 40 made of a semiconductor except in unique variations (modifications).

A crystal structure of the semiconductor layer 40 is a cubical crystal structure. Specifically, its crystal structure is configured with a zincblende structure or a NaCl type structure (rock salt type structure).

Specific material for the semiconductor layer 40 may be, for example, as follows: ZnSe, AlN, AlP, GaN, GaP, GaAs, GaSb, InAs, ZnS, ZnTe or the like, and compounds thereof.

The most important factor is that the semiconductor layer (spacer layer) 40 is epitaxially formed on the first ferromagnetic layer 50 under the condition of the epitaxial growth. Namely, the first ferromagnetic layer 50 and the semiconductor layer 40 are formed with a (001) orientation, respectively.

The term "epitaxial growth" is defined as a ratio of a lattice mismatch between the first ferromagnetic layer 50 and the semiconductor layer 40 is less than 10%. The "lattice mismatch" is an index indicating a difference of a lattice constant that is expressed in terms of percentage. When the lattice mismatch is 0%, there is a high possibility that an interface is formed with a complete matching. Of course the lattice mismatch is defined as the least calculated difference among any combinations, for example, using the following: an integral multiple of a lattice constant, a scale of one to an integral multiple of a lattice constant, and a $\sqrt{2}$ multiple of a lattice constant.

In summary, an epitaxial growth in which the lattices are aligned and organized must be realized.

Detailed examples of a "lattice mismatch" are discussed in the experiment below.

[Explanation of Magnetic Pinned Layer 30 as Second Ferromagnetic Layer]

In the preferred embodiment according to the present invention, the magnetic pinned layer 30 is formed on the semiconductor layer (spacer layer) 40. The magnetic pinned layer 30 is magnetically pinned by an influence of the antiferromagnetic layer 22 that is formed on the magnetic pinned layer 30.

It is preferred that the magnetic pinned layer 30 is formed from the same materials as the free layer 50, which is the first ferromagnetic layer 30. Namely, it is preferred that the magnetic pinned layer 30 is configured with CoFe, $Fe_4N$, or a Heusler alloy.

It is particularly preferred that the magnetic pinned layer 30 is formed on the semiconductor layer (spacer layer 40) with a (001) orientation and a condition of an epitaxial growth.

The magnetic pinned layer 30 can be configured with a single layer structure. The magnetic pinned layer 30 may also be a multiple-layer structure including several laminated ferromagnetic layers as far as they do not depart from the effect of the present invention.

[Explanation of Antiferromagnetic Layer 22]

As discussed above, since the antiferromagnetic layer 22 is exchange-coupled with the magnetic pinned layer 30, the antiferromagnetic layer 22 functions to pin a magnetization direction of the magnetic pinned layer 30.

The antiferromagnetic layer 22 is made of an antiferromagnetic material at least containing one element M' and Mn. Herein, the element M' is selected from a group, for example, consisting of Pt, Ru, Rh, Pd, Ni, Cu, Ir, Cr, and Fe. The Mn content is preferably 35 to 95% by atomic weight. The antiferromagnetic materials are categorized in two types:

(1) non-heat treatment type antiferromagnetic materials that exhibit antiferromagnetism without heat treatment and induce an exchange-coupled magnetic field between themselves and a ferromagnetic material; and (2) heat treatment type antiferromagnetic materials that exhibit antiferromagnetism with heat treatment. In the above type (1), heat treatment is usually performed to align an exchange-coupling direction. Either type (1) or (2) can be used in the present invention. Examples of non-heat treatment type antiferromagnetic materials include RuRhMn, FeMn, and IrMn. Examples of heat treatment type antiferromagnetic materials include PtMn, NiMn, and PtRhMn.

The antiferromagnetic layer 22 has a thickness of approximately 4 to 30 nm.

[Explanation of Under Layer 21]

The under layer 21 is formed below the free layer 50. The preferred under layer 21 shown in FIG. 1 is configured with a two-layer structure of including the orientation under layer 21b and a base under layer 21a.

The base under layer 21a is made from a thin film in an amorphous status. The base under layer 21a functions as a resetter for preventing an orientation influence caused by the lower electrode layer 3. The base under layer 21a has a thickness of approximately 1 to 20 nm and is made of, for example, Ta, CoFeB, CoTa, CoZr, CoNb, CoZrTa, CoZrNb, or CoNbTa.

The orientation under layer 21b is formed to orient the first ferromagnetic layer 50, which is formed on the orientation under layer 21b, in a (001) orientation. For example, the orientation under layer 21b is made of NiFeN with a layer thickness of approximately 0.5 to 20 nm. The NiFeN orientation under layer 21b with the (001) orientation is formed by a sputtering method in an argon atmosphere to which a nitrogen gas is added. The content ratio of nitrogen in the layer is approximately 0.5 to 25% by atomic weight. More preferably, it is 2 to 15% by atomic weight.

When the content of nitrogen exceeds the range mentioned above, the (001) orientation of the orientation under layer 21b is difficult to achieve.

[Explanation of Cap Layer 26]

As shown in FIG. 1, a cap layer 26 that is made of, for example, a Ta layer or a Ru layer is formed on the antiferromagnetic layer 22. The cap layer 26 has a thickness of approximately 0.5 to 20 nm.

[Explanation of Variations of Element Configuration]

Variation 1

A nonmagnetic layer, which does not obstruct a spin conveyance, may be inserted between the first ferromagnetic layer 50 and the semiconductor layer 40 and/or the second ferromagnetic layer 30 and the semiconductor layer 40.

A material of the nonmagnetic layer is, for example, Cu, Zn, Ag, Au. A thickness of the nonmagnetic layer is approximately 0.2 to 2.0 nm.

The nonmagnetic layer is required to have a growth style that does not obstruct an epitaxial growth between the first ferromagnetic layer 50 and the semiconductor layer 40 and/or the second ferromagnetic layer 30 and the semiconductor layer 40.

In this case, a three-layer lamination layer in which the semiconductor layer 40 is located in the center, such as Cu/semiconductor layer 40/Cu, or Zn/semiconductor layer 40/Zn, or Zn/semiconductor layer 40/Cu, or a two-layer lamination layer in which an upper nonmagnetic layer or a lower nonmagnetic layer is excluded from the three-layer lamination layer is inserted between the first ferromagnetic layer 50 and the second ferromagnetic layer 30.

Variation 2

In the present invention, an MR element in which the condition of two magnetic layers functioning as a sensor relatively changes due to an externally applied magnetic field can be applied. In other words, the present invention is not limited to a type or a structure of an element explained above. A structure of the present invention can be applied to an MR element that has a simple three-layer lamination layer structure as a basic structure including two free layers, such as a first ferromagnetic layer/a spacer layer/a second ferromagnetic layer, disclosed in, for example, U.S. Pat. No. 7,019,371B2 and U.S. Pat. No. 7,035,062B1. Namely, a preferred element has a structure as follows. A spacer layer is made of a semiconductor layer, and is epitaxially formed on a first ferromagnetic layer, and more preferably, a second ferromagnetic layer is epitaxially-formed on the spacer layer.

[Explanation of Overall Structure of Thin Film Magnetic Head]

FIG. 2 shows a sectional view (i.e., a cross section taken through the Y-Z plane) of a thin film magnetic head in parallel with the so-called air bearing surface (ABS).

A thin film magnetic head 100 as shown in FIG. 2 is mounted on a magnetic recording device such as a hard disk drive in order to magnetically process a recording medium 10 such as a hard disk that moves in a medium traveling direction M.

The thin film magnetic head 100 as exemplified in the drawing is a so-called complex type head that is executable for both recording processing and reproducing processing as magnetic processing. As shown in FIG. 2, it has a structure of a magnetic head part 101 formed on a slider substrate 1 structured of ceramic material such as ALTIC ($Al_2O_3$.TiC).

A magnetic head part 101 has a lamination constitution of a reproducing head part 100A for reproducing magnetic information recorded using the MR effect and, for example, a shield type recording head part 100B for executing the recording processing of the perpendicular recording system.

A description is given below in more detail.

A first shield layer 3 and a second shield layer 5 are flat layers formed in a manner of being substantially parallel to the side surface 1a of the slider substrate 1. The layers 3 and 5 form a part of the ABS 70.

An MR effect part 8 is sandwiched between the first shield layer 3 and the second shield layer 5 and forms part of the ABS 70. A height perpendicular to the ABS 70 (i.e., in the Y direction) is an MR height (MR-h).

The first shield layer 3 and the second shield layer 5 are formed by a pattern plating method including a frame plating method, for example.

The MR effect part 8 is a lamination layer substantially parallel to the side surface 1a of the slider substrate 1, and forms a part of the ABS 70.

The MR effect part 8 is a lamination layer in a film surface perpendicular type (or current perpendicular to plane: CPP) structure in which a sense current flows in the direction perpendicular to the laminating surface.

Moreover, as shown in FIG. 2, an interelement shield layer 9 made of the same material as that of the second shield layer 5 is formed between the second shield layer 5 and the recording head part 100B.

The interelement shield layer 9 shields the MR element 8 from a magnetic field generated by the recording head part 100B, thereby blocking exogenous noises at the time of reproduction. A bucking coil part may also be formed between the interelement shield layer 9 and the recording head part 100B. The bucking coil part generates magnetic flux that overrides a magnetic flux loop that is generated by the recording head part 100B and that passes through the upper and lower electrode layers of the MR element 8 and, therefore, suppresses unnecessary writing to a magnetic disk or wide area adjacent tracks erasing (WATE) phenomena that are erasing operations.

Insulating films 4 and 44 made of alumina and/or other materials are formed as follows:

i) in a gap between the first shield layer 3 and the second shield layer 5 on the side opposite to the ABS 70 of the MR element 8;

ii) in rear (posterior) regions of the first and second shield layers 3 and 5 and the interelement shield layer 9, the rear regions being opposite to the ABS 70;

iii) in a gap between the first shield layer 3 and the slider substrate 1; and iv) in a gap between the interelement shield layer 9 and the recording head part 100B.

The recording head part 100B is preferably structured for perpendicular magnetic recording and, as shown in FIG. 2, has a main magnetic pole layer 15, a gap layer 18, a coil insulating layer 26, a coil layer 23, and an auxiliary magnetic pole layer 25. The perpendicular recording system can be exchanged with a so-called longitudinal recording system.

The main magnetic pole layer 15 is structured to be a leading magnetic path for leading and focusing magnetic flux initiated by the coil layer 23 to the recording layer of a magnetic recording medium 10. It is preferred that the end part of the main magnetic pole layer 15 on the side of the ABS 70 should be smaller in thickness compared with other portions in the track width direction (i.e., the direction along the X-axis in FIG. 2) and in the laminating direction (i.e., the direction along the Z-axis in FIG. 2). As a result, it is possible to generate a magnetic field for minute and strong writing corresponding to high recording density.

A trailing shield part that has a wider layer cross section than the other portions of the auxiliary magnetic layer 25 is formed on the end part of the auxiliary magnetic pole layer 25 magnetically coupled with the main magnetic pole layer 15 on the side of the ABS 70. As shown in FIG. 2, the auxiliary magnetic pole layer 25 is opposed to the end part of the main magnetic pole layer 15 on the side of the ABS 70 via the gap layer 18 made of insulating material such as alumina and the coil insulating layer 26.

The provision of the auxiliary magnetic pole layer 25 enables formation of a steep magnetic field gradient between the auxiliary magnetic pole layer 25 and the main magnetic pole layer 15 in the vicinity of the ABS 70. As a result, jitter is reduced in a signal output, thereby making the error rate smaller at the time of reproducing.

The auxiliary magnetic pole layer 25 is formed, for example, to about 0.5-5 μm in thickness by a frame plating method, a sputtering method or the like. The material may be an alloy made of two or three elements selected from the group consisting of Ni, Fe and Co, for example, or an alloy made of these elements, as main components, along with predetermined chemical elements.

The gap layer 18 is formed to separate the coil layer 23 from the main magnetic pole layer 15. The gap layer 18 may be formed by a sputtering method, a CVD method or the like, for example, have a thickness of about 0.01-0.5 μm and be structured of $Al_2O_3$, diamond-like carbon (DLC) or the like.

[Explanation of Head Gimbal Assembly and Hard Disk Device]

Next, a head gimbal assembly on which the above mentioned thin film head is mounted and one embodiment of a hard disk device are described below.

First, a description of a slider 210 equipped with the head gimbal assembly is illustrated in FIG. 3. In the hard disk device, the slider 210 is opposed to a hard disk that is a rotatably driven disk-like recording medium. The slider 210 is provided with a base substrate 211 mainly configured of a substrate and an overcoat.

The base substrate 211 is substantially hexahedronal. Of the six surfaces of the base substrate 211, one surface is opposed to a hard disk. The ABS 70 is formed on the surface.

When a hard disk is rotated in the Z direction in FIG. 3, an airflow passing between the hard disk and the slider 210 creates lifting power downwardly in the Y direction in FIG. 3. The slider 210 floats from the surface of the hard disk by this lifting power. The X direction in FIG. 3 is the track traversing direction of the hard disk.

In the vicinity of the end part of the slider 210 on the air exit side (i.e., the end part on the lower left in FIG. 3), the thin film magnetic head according to the present embodiment is formed.

Next, a description of the head gimbal assembly 220 according to the present embodiment is described by referring to FIG. 4. The head gimbal assembly 220 is provided with the slider 210 and a suspension 221 for elastically supporting the slider 210. The suspension 221 has a plate spring load beam 222 formed of stainless steel, a flexure 223 that is provided on one end part of the load beam 222 and joined with the slider 210 in a manner of giving the slider 210 a proper degree of freedom, and a base plate 224 provided on the other end part of the load beam 222.

The base plate 224 is mounted on an arm 230 of an actuator for moving the slider 210 in the track traversing direction X of the hard disk 262. The actuator has the arm 230 and a voice coil motor for driving the arm 230. A gimbal part is provided for keeping a posture of the slider 210 constant on the portion of the flexure 223 on which the slider 210 is mounted.

The head gimbal assembly 220 is mounted on the arm 230 of the actuator. One arm 230 with a head gimbal assembly 220 mounted thereon is called a head arm assembly. A carriage having multiple arms, each of which has a head gimbal assembly mounted thereon, is referred as a head stack assembly.

FIG. 4 shows one embodiment of a head arm assembly. In this head arm assembly, a head gimbal assembly 220 is mounted on one end part of the arm 230. A coil 231, part of a voice coil motor, is mounted on the other end part of the arm 230. A bearing part 233 is provided in the middle part of the arm 230 so that a shaft 234 is rotatably supported.

A description of one example of the head stack assembly and the hard disk device according to the present embodiment is described by referring to FIGS. 5 and 6.

FIG. 5 is an illustration for explaining primary parts of a hard disk device. FIG. 6 is a plan view of the hard disk device.

The head stack assembly 250 has a carriage 251 having multiple arms 252. On the multiple arms 252 are mounted multiple head gimbal assemblies 220 in the perpendicular direction at certain intervals. A coil 253, part of a voice coil motor, is mounted on the opposite side of the arms 252 in the carriage 251. The head stack assembly 250 is incorporated into a hard disk device.

A hard disk device has multiple hard disks 262 mounted on a spindle motor 261. Two sliders 210 are disposed for each hard disk 262 in a manner of being opposed to each other by sandwiching the hard disk 262. The voice coil motor has permanent magnets 263 disposed in a manner of being opposed to each other by sandwiching the coil 253 of the head stack assembly 250.

The head stack assembly 250 and an actuator except for sliders 210 support as well as locate the slider 210 relative to the hard disk 22 corresponding to a positioning device of the present invention.

In the hard disk device according to the present embodiment, an actuator allows moving sliders 210 in the track traversing direction of the hard disk 262 in order to position sliders 210 relative to the hard disk 262. Thin film magnetic heads included in sliders 210 record information on the hard disk 262 by the recording head and reproduce (or read) information recorded in the hard disk 262 by the reproducing head.

The head gimbal assembly and hard disk device according to the present embodiment are as effective as the thin film magnetic head according to the above-mentioned embodiment.

In the embodiment, it is explained that a thin film magnetic head has a structure of a reproducing head part formed on the base substrate side and a perpendicular recording head part layered thereon. However, the layering order may be reversed. Moreover, the configuration may be such that only a reproducing part is provided in the case of a reproduction-only thin film head.

Exemplary Embodiment

The present invention related to a CPP-GMR element discussed above is explained through a detailed exemplary embodiment.

Experiment 1

A coercive force differential type magnetoresistive effect layer configured with a lamination structure as shown in Table 1 is formed by a sputtering method. The coercive force differential type magnetoresistive effect layer is a layer that forms a parallel state and an antiparallel state by utilizing a coercive force difference between two magnetic layers so that a magnetoresistive effect can be created. The coercive force differential type magnetoresistive effect layer has a benefit that it is not necessary to form a magnetic pinned layer by forming an antiferromagnetic layer. After the coercive force differential type magnetoresistive effect layer is formed, an annealing process, at 250° C. for three hours, is performed.

As shown in Table 1, a basic structure of a lamination structure is that a base under layer and an orientation under layer, which configure an under layer, were formed on a lower shield layer that has a layer thickness of 1,000 nm and that was made of NiFe. The following lamination layers were formed on the lamination layers discussed above in a bottom up direction: a first ferromagnetic layer; a semiconductor layer as a spacer layer; a second ferromagnetic layer; and a cap layer with a two-layer structure configured with Ru with a layer thickness of 1.0 nm and Ta with a layer thickness of 2.0 nm.

TABLE 1

| Lamination Structure | Layer Material | Layer Thickness (nm) |
|---|---|---|
| Cap Layer (26) | Ta | 2.0 |
|  | Ru | 1.0 |
| Second Ferromagnetic Layer (30) | Table 2 | Table 2 |
| Semiconductor Layer (40) | Table 2 | Table 2 |
| First Ferromagnetic Layer (50) | Table 2 | Table 2 |

TABLE 1-continued

| Lamination Structure | | Layer Material | Layer Thickness (nm) |
|---|---|---|---|
| Under Layer (21) | Orientation Under Layer (21b) | Table 2 | Table 2 |
| | Base Under layer (21a) | Table 2 | Table 2 |
| Lower Shield Layer (3) | | NiFe | 1000 |

A lamination layer discussed above that forms a main structure of an element was fabricated in a quadrangular prism shape with dimensions of 200 nm×200 nm. Then, an insulating material ($Al_2O_3$) with a layer thickness of 20.0 nm covered sides of the fabricated quadrangular prism shape, and an upper electrode layer (Cu 200 nm) was formed at the top portion. As a result, Samples No. 1 to No. 46 as shown in Table 2 of a CPP-GMR element were made.

TABLE 2

| Sample No. | Lower Shield Layer (nm) | Under Layer Base Under Layer (nm) | Under Layer Orientation Under Layer (nm) | First Ferromagnetic Layer (nm) | Semiconductor Layer (nm) | Second Ferromagnetic Layer (nm) | Epitaxial Growth Condition | MR Ratio (%) |
|---|---|---|---|---|---|---|---|---|
| 1 | NiFe (1000) | CoFeB (3) | NiFeN (5) | CoFe (5) | ZnSe (1.5) | CoFe (5) | 2 | 50.3 |
| 2* | NiFe(1000) | CoFeB (3) | NiFeN (5) | CoFe (5) | ZnSe (1.5) | CoFe (5) | 0 | 16.0 |
| 3 | NiFe (1000) | CoFeB (3) | NiFeN (5) | CoFe (5) | ZnSe (1.5) | NiFe (1)/CoFe (4.5) | 1 | 25.5 |
| 4* | Si | MgO (3) | Cr (2) | CoFe (5) | ZnSe (1.5) | CoFe (5) | 2 | 41.2 |
| 5* | NiFe (1000) | CoFeB (3) | NiFeN (5) | CoFe (5) | ZnO (1.6) | CoFe (5) | 0 | 17.9 |
| 6 | NiFe (1000) | CoFeB (3) | NiFeN (5) | CoFe (5) | AlN (1.3) | CoFe (5) | 2 | 28.7 |
| 7 | NiFe (1000) | CoFeB (3) | NiFeN (5) | CoFe (5) | AlP (1.5) | CoFe (5) | 2 | 42.0 |
| 8 | NiFe (1000) | CoFeB (3) | NiFeN (5) | CoFe (5) | GaN (1.6) | CoFe (5) | 2 | 44.3 |
| 9 | NiFe (1000) | CoFeB (3) | NiFeN (5) | CoFe (5) | GaP (1.7) | CoFe (5) | 2 | 36.5 |
| 10 | NiFe (1000) | CoFeB (3) | NiFeN (5) | CoFe (5) | GaAs (1.7) | CoFe (5) | 2 | 50.0 |
| 11 | NiFe (1000) | CoFeB (3) | NiFeN (5) | CoFe (5) | GaSb (1.8) | CoFe (5) | 2 | 50.1 |
| 12 | NiFe (1000) | CoFeB (3) | NiFeN (5) | CoFe (5) | InP (1.7) | CoFe (5) | 2 | 44.0 |
| 13 | NiFe (1000) | CoFeB (3) | NiFeN (5) | CoFe (5) | InAs (1.9) | CoFe (5) | 2 | 43.0 |
| 14* | NiFe (1000) | CoFeB (3) | NiFeN (5) | CoFe (5) | InSb (1.9) | CoFe (5) | 0 | 10.4 |
| 15 | NiFe (1000) | CoFeB (3) | NiFeN (5) | CoFe (5) | ZnS (1.7) | CoFe (5) | 2 | 51.0 |
| 16 | NiFe (1000) | CoFeB (3) | NiFeN (5) | CoFe (5) | ZnTe (2.0) | CoFe (5) | 2 | 51.5 |
| 17 | NiFe (1000) | CoFeB (3) | NiFeN (5) | CoFe (5) | NiO (2.0) | CoFe (5) | 2 | 37.3 |
| 18 | NiFe (1000) | CoFeB (3) | NiFeN (5) | CoFe (5) | SiC (1.5) | CoFe (5) | 2 | 34.0 |
| 19 | NiFe (1000) | CoFeB (3) | NiFeN (5) | CoMnSi (5) | AlN (1.3) | CoMnSi (5) | 2 | 33.3 |
| 20 | NiFe(1000) | CoFeB (3) | NiFeN (5) | CoMnSi (5) | AlP (1.5) | CoMnSi (5) | 2 | 37.4 |
| 21* | NiFe (1000) | CoFeB (3) | NiFeN (5) | CoMnSi (5) | GaN (1.6) | CoMnSi (5) | 0 | 11.3 |
| 22 | NiFe (1000) | CoFeB (3) | NiFeN (5) | CoMnSi (5) | GaP (1.7) | CoMnSi (5) | 2 | 41.7 |
| 23 | NiFe (1000) | CoFeB (3) | NiFeN (5) | CoMnSi (5) | GaAs (1.7) | CoMnSi (5) | 2 | 48.3 |
| 24 | NiFe (1000) | CoFeB (3) | NiFeN (5) | CoMnSi (5) | GaSb (1.8) | CoMnSi (5) | 2 | 47.8 |
| 25 | NiFe (1000) | CoFeB (3) | NiFeN (5) | CoMnSi (5) | InP (1.7) | CoMnSi (5) | 2 | 41.7 |
| 26 | NiFe (1000) | CoFeB (3) | NiFeN (5) | CoMnSi (5) | InAs (1.9) | CoMnSi (5) | 2 | 39.6 |
| 27* | NiFe (1000) | CoFeB (3) | NiFeN (5) | CoMnSi (5) | InSb (1.9) | CoMnSi (5) | 0 | 8.7 |
| 28 | NiFe (1000) | CoFeB (3) | NiFeN (5) | CoMnSi (5) | ZnS (1.7) | CoMnSi (5) | 2 | 47.7 |
| 29 | NiFe (1000) | CoFeB (3) | NiFeN (5) | CoMnSi (5) | ZnSe (2.0) | CoMnSi (5) | 2 | 32.6 |
| 30 | NiFe (1000) | CoFeB (3) | NiFeN (5) | CoMnSi (5) | ZnTe (2.0) | CoMnSi (5) | 2 | 48.2 |
| 31 | NiFe (1000) | CoFeB (3) | NiFeN (5) | CoMnSi (5) | NiO (2.0) | CoMnSi (5) | 2 | 33.5 |
| 32* | NiFe (1000) | CoFeB (3) | NiFeN (5) | CoMnSi (5) | SiC (1.5) | CoMnSi (5) | 0 | 14.0 |
| 33* | NiFe (1000) | CoFeB (3) | NiFeN (5) | $Fe_4N$ (5) | AlN (1.3) | $Fe_4N$ (5) | 0 | 4.3 |
| 34 | NiFe(1000) | CoFeB (3) | NiFeN (5) | $Fe_4N$ (5) | AlP (1.5) | $Fe_4N$ (5) | 2 | 36.5 |
| 35* | NiFe (1000) | CoFeB (3) | NiFeN (5) | $Fe_4N$ (5) | GaN (1.6) | $Fe_4N$ (5) | 0 | 6.3 |
| 36 | Si | CoFeB (3) | NiFeN (2) | $Fe_4N$ (5) | GaP (1.7) | $Fe_4N$ (5) | 2 | 36.9 |
| 37 | NiFe (1000) | CoFeB (3) | NiFeN (5) | $Fe_4N$ (5) | GaAs (1.7) | $Fe_4N$ (5) | 2 | 36.0 |
| 38* | NiFe (1000) | CoFeB (3) | NiFeN (5) | $Fe_4N$ (5) | GaSb (1.8) | $Fe_4N$ (5) | 0 | 7.5 |

TABLE 2-continued

| Sample No. | Lower Shield Layer (nm) | Under Layer Base Under Layer (nm) | Orientation Under Layer (nm) | First Ferromagnetic Layer (nm) | Semiconductor Layer (nm) | Second Ferromagnetic Layer (nm) | Epitaxial Growth Condition | MR Ratio (%) |
|---|---|---|---|---|---|---|---|---|
| 39 | NiFe (1000) | CoFeB (3) | NiFeN (5) | Fe$_4$N (5) | InP (1.7) | Fe$_4$N (5) | 2 | 32.9 |
| 40* | NiFe (1000) | CoFeB (3) | NiFeN (5) | Fe$_4$N (5) | InAs (1.9) | Fe$_4$N (5) | 0 | 5.1 |
| 41* | NiFe (1000) | CoFeB (3) | NiFeN (5) | Fe$_4$N (5) | InSb (1.9) | Fe$_4$N (5) | 0 | 7.5 |
| 42 | NiFe (1000) | CoFeB (3) | NiFeN (5) | Fe$_4$N (5) | ZnS (1.7) | Fe$_4$N (5) | 2 | 37.9 |
| 43 | NiFe (1000) | CoFeB (3) | NiFeN (5) | Fe$_4$N (5) | ZnSe (2.0) | Fe$_4$N (5) | 2 | 31.4 |
| 44* | NiFe (1000) | CoFeB (3) | NiFeN (5) | Fe$_4$N (5) | ZnTe (2.0) | Fe$_4$N (5) | 0 | 6.7 |
| 45* | NiFe (1000) | CoFeB (3) | NiFeN (5) | Fe$_4$N (5) | NiO (2.0) | Fe$_4$N (5) | 0 | 9.9 |
| 46* | NiFe (1000) | CoFeB (3) | NiFeN (5) | Fe$_4$N (5) | SiC (1.5) | Fe$_4$N (5) | 0 | 4.6 |

In Table 2, an "*" mark next to a number shows that a sample is a comparison sample other than the present invention.

In Sample No. 3, NiFe (1) is a lower layer of a second ferromagnetic layer and contacts a semiconductor layer.

An epitaxial growth condition "0" means that epitaxial growth is not configured both between a first ferromagnetic layer 50 and a semiconductor layer 40 and between the semiconductor layer 40 and the second ferromagnetic layer 30. An epitaxial growth condition "1" means that epitaxial growth is configured between the first ferromagnetic layer 50 and the semiconductor layer 40, but epitaxial growth is not configured between the semiconductor layer 40 and the second ferromagnetic layer 30. An epitaxial growth condition "2" means that epitaxial growth is configured both between the first ferromagnetic layer 50 and the semiconductor layer 40 and between the semiconductor layer 40 and the second ferromagnetic layer 30.

"Epitaxial growth is configured" means that a lattice mismatch of each interface is less than 10%.

A state of a lattice mismatch is shown in experimental results in Table 3 discussed later. As known from Table 3, a lattice mismatch means that an index of a difference of a lattice constant is expressed in terms of percentage. When the lattice mismatch is 0%, there is a high possibility that an interface is formed with a complete matching. Of course the lattice mismatch is defined as the least calculated difference among any combinations, for example, using the following: an integral multiple of a lattice constant, a scale of one to an integral multiple of a lattice constant, and a $\sqrt{2}$ multiple of a lattice constant.

Before experimental results in Table 2 are considered, data with respect to a lattice mismatch of Sample Nos. 1, and 6 to 46, are shown in Table 3 below. Note that an MR ratio in Table 2 is written in Table 3 as well.

TABLE 3

| Sample No. | Magnetic Layer | Lattice Constant (Å) | Semiconductor Layer | Lattice Constant (Å) | Lattice Mismatch (%) | MR Ratio (%) |
|---|---|---|---|---|---|---|
| 6 | CoFe | 2.845 | AlN | 4.318 | 7.3 | 28.7 |
| 7 | CoFe | 2.845 | AlP | 5.421 | 4.7 | 42.0 |
| 8 | CoFe | 2.845 | GaN | 4.364 | 8.5 | 44.3 |
| 9 | CoFe | 2.845 | GaP | 5.451 | 4.2 | 36.5 |
| 10 | CoFe | 2.845 | GaAs | 5.654 | 0.6 | 50.0 |
| 11 | CoFe | 2.845 | GaSb | 6.095 | 7.1 | 50.1 |
| 12 | CoFe | 2.845 | InP | 5.869 | 3.1 | 44.0 |
| 13 | CoFe | 2.845 | InAs | 6.059 | 6.5 | 43.0 |
| 14* | CoFe | 2.845 | InSb | 6.479 | 13.9 | 10.4 |
| 15 | CoFe | 2.845 | ZnS | 5.409 | 4.9 | 51.0 |
| 1 | CoFe | 2.845 | ZnSe | 5.669 | 0.4 | 50.3 |
| 16 | CoFe | 2.845 | ZnTe | 6.103 | 7.3 | 51.5 |
| 17 | CoFe | 2.845 | NiO | 4.179 | 3.8 | 37.3 |
| 18 | CoFe | 2.845 | SiC | 4.360 | 8.4 | 34.0 |
| 19 | CoMnSi | 2.796 | AlN | 4.318 | 9.2 | 33.3 |
| 20 | CoMnSi | 2.796 | AlP | 5.421 | 3.1 | 37.4 |
| 21* | CoMnSi | 2.796 | GaN | 4.364 | 10.4 | 11.3 |
| 22 | CoMnSi | 2.796 | GaP | 5.451 | 2.5 | 41.7 |
| 23 | CoMnSi | 2.796 | GaAs | 5.654 | 1.1 | 48.3 |
| 24 | CoMnSi | 2.796 | GaSb | 6.095 | 9.0 | 47.8 |
| 25 | CoMnSi | 2.796 | InP | 5.869 | 5.0 | 41.7 |
| 26 | CoMnSi | 2.796 | InAs | 6.059 | 8.3 | 39.6 |
| 27* | CoMnSi | 2.796 | InSb | 6.479 | 15.9 | 8.7 |
| 28 | CoMnSi | 2.796 | ZnS | 5.409 | 3.3 | 47.7 |
| 29 | CoMnSi | 2.796 | ZnSe | 5.669 | 1.4 | 52.6 |
| 30 | CoMnSi | 2.796 | ZnTe | 6.103 | 9.1 | 48.2 |

US 8,331,063 B2

TABLE 3-continued

| Sample No. | Magnetic Layer | Lattice Constant (Å) | Semiconductor Layer | Lattice Constant (Å) | Lattice Mismatch (%) | MR Ratio (%) |
|---|---|---|---|---|---|---|
| 31 | CoMnSi | 2.796 | NiO | 4.179 | 5.6 | 33.5 |
| 32* | CoMnSi | 2.796 | SiC | 4.360 | 10.3 | 14.0 |
| 33* | Fe$_4$N | 3.790 | AlN | 4.318 | 13.9 | 4.3 |
| 34 | Fe$_4$N | 3.790 | AlP | 5.421 | 1.1 | 36.5 |
| 35* | Fe$_4$N | 3.790 | GaN | 4.364 | 15.1 | 6.3 |
| 36 | Fe$_4$N | 3.790 | GaP | 5.451 | 1.7 | 36.9 |
| 37 | Fe$_4$N | 3.790 | GaAs | 5.654 | 5.5 | 36.0 |
| 38* | Fe$_4$N | 3.790 | GaSb | 6.095 | 13.7 | 7.5 |
| 39 | Fe$_4$N | 3.790 | InP | 5.869 | 9.5 | 32.9 |
| 40* | Fe$_4$N | 3.790 | InAs | 6.059 | 13.0 | 5.1 |
| 41* | Fe$_4$N | 3.790 | InSb | 6.479 | 20.9 | 7.5 |
| 42 | Fe$_4$N | 3.790 | ZnS | 5.409 | 0.9 | 37.9 |
| 43 | Fe$_4$N | 3.790 | ZnSe | 5.669 | 5.8 | 31.4 |
| 44* | Fe$_4$N | 3.790 | ZnTe | 6.103 | 13.9 | 6.7 |
| 45* | Fe$_4$N | 3.790 | NiO | 4.179 | 10.2 | 9.9 |
| 46* | Fe$_4$N | 3.790 | SiC | 4.360 | 15.0 | 4.6 |

[Consideration of Experimental Results in Table 2]

Experimental results in Table 2 are considered with reference to Table 3.

Sample Nos. 1 and 2

Sample No. 2 compared with Sample No. 1 is configured with a structure in which NiFeN (Sample No. 1), which is an under layer for a first ferromagnetic layer and is an orientation under layer 21b directly contacting the first ferromagnetic layer, is replaced with NiFe (Sample No. 2). A layer with NiFeN means NiFe in which a crystal system is changed by mixing nitrogen when a nitrogen partial pressure for a layer forming process is 50%. Since a NiFeN orientation under layer mixed with nitrogen is adopted, an MR ratio increased from 16.0% (Sample No. 2) to 50.3% (Sample No. 1). In order to determine the results discussed above, an experiment for confirming a crystal structure was performed as discussed below.

Experiment for Confirming Crystal Structure

In order to confirm a crystal structure, two kinds of films were formed.

Specifically, the following two films were formed:

(1) films CoFeB (thickness of 3.0 nm)/NiFeN (thickness of 10.0 nm)/CoFe (thickness of 10.0 nm)/Ru (thickness of 1.0 nm)/Ta (thickness of 2.0 nm), were formed on an Si substrate; and (2) films CoFeB (thickness of 3.0 nm)/NiFe (thickness of 10.0 nm)/CoFe (thickness of 10.0 nm)/Ru (thickness of 1.0 nm)/Ta (thickness of 2.0 nm), were formed on a Si substrate.

An XRD measurement was performed on the films (1) and (2) for a structural analysis purposes.

Figure 7:
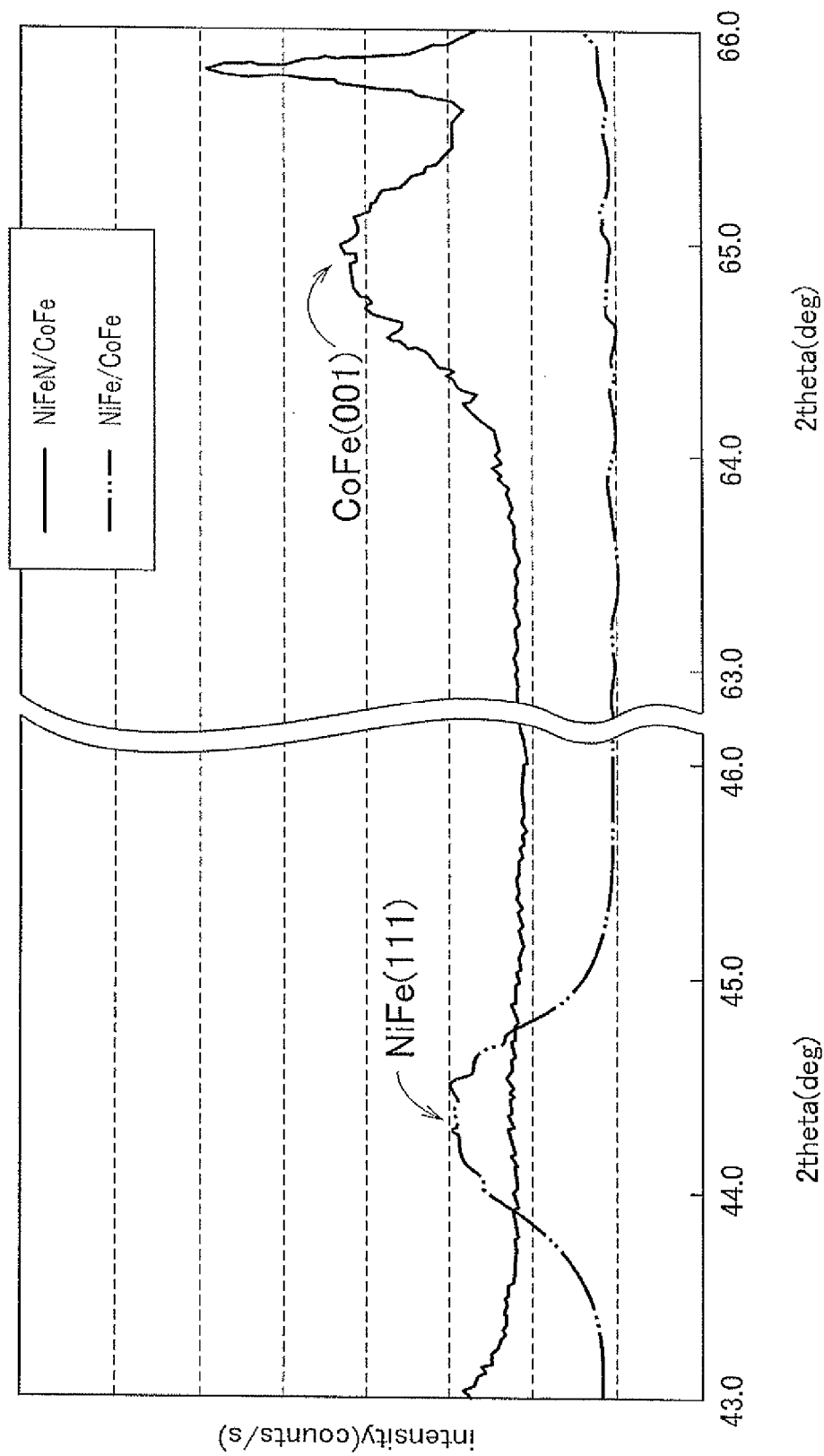
FIG. 7 is a graph for showing primary parts of an X-ray powder diffraction (XDR) analysis pattern for a lamination layer that CoFe is formed on NiFeN and for another lamination layer that CoFe is formed on NiFe.

Primary parts of an XRD pattern of the film (1) using NiFeN and an XRD pattern of the film (2) using NiFe are shown in FIG. 7.

In the graph shown in FIG. 7, with respect to a sample with a NiFeN under layer (solid line), a NiFe (111) peak, which is seen at around 44 degrees, disappears and a CoFe (111) peak, which is seen at around 65 degrees, appears.

On the other hand, in a sample using a NiFe under layer (two-dot chain line), NiFe is oriented to a (111) orientation as usual. CoFe formed thereon is not in a (001) orientation ((110) orientation). Namely, it is confirmed that a CoFe (001) orientation is promoted by inserting a NiFeN orientation under layer.

Sample No. 3

Sample No. 3 has a NiFe layer inserted in an interface between the semiconductor layer 40 and the second ferromagnetic layer 30 of Sample No. 1. Since an epitaxial growth seems to be prevented at the interface, as a result, an MR ratio is reduced by half.

Insertion of an epitaxial interface between a magnetic layer and a semiconductor layer has an effect with one side insertion. However, the epitaxial interface with both sides is preferably inserted. It is understood that it is preferable to form a first ferromagnetic layer, a semiconductor layer (spacer layer), and a second ferromagnetic layer in a epitaxial growth condition.

Sample No 4

Sample No. 4 utilizes the following layer forming method: a CoFe layer in a (001) orientation is formed when MgO/Cr/CoFe are formed on a Si substrate in a (001) orientation. Sample No. 4 should have an epitaxial interface that is the same as Sample No. 1; however, an MR ratio is 41.2%, which is slightly lower than one of Sample No. 1. It is presumed that Sample No. 4 uses a special element fabrication process to pull out a lower electrode in an in-plane direction of a film surface because the lower electrode cannot be formed just below an element. This is also because Sample No. 4 uses Si and MgO, which have a high resistance, as a substrate. It is understood that since a parasitic resistance is increased due to a structural issue of an electrode and wiring, an MR ratio is decreased.

In Sample No. 4, a semiconductor layer is also formed on a first ferromagnetic layer under the condition of epitaxial growth. However, in the present invention, since this special application element does not produce a CPP-GMR element with a simple structure, with an element is sandwiched by upper and lower electrodes, Sample 4 is out of the scope of the present invention.

Sample No. 5

Sample No. 5 uses ZnO for the semiconductor layer.

ZnO has a strong polar character and tends to have a hexagonal wurtzite structure. Since ZnO in Sample No. 5 is a wurtzite structure, it is considered that there is no epitaxial growth. Because an MR ratio of Sample No. 5 is low, 17.9%, it is presumed that the low MR ratio is a result of no epitaxial growth in an interface between a magnetic layer and a semiconductor layer.

Sample Nos. 6 to 46

As discussed above, Table 3 shows a lattice mismatch between a magnetic layer and a semiconductor layer with respect to samples of a combination of several types of the semiconductor layer 40 with CoFe, CoMnSi, or Fe$_4$N.

The term "lattice mismatch" means that an index of a difference of a lattice constant is expressed in terms of percentage. When the lattice mismatch is 0%, there is a high possibility that an interface is formed with a complete matching. In case of CoFe and CoMnSi, a double lattice constant of a magnetic layer and a lattice constant of a semiconductor layer are compared. In case of $Fe_4N$, a $\sqrt{2}$ multiple of a lattice constant of a magnetic layer and a lattice constant of a semiconductor layer are compared.

Figure 8:
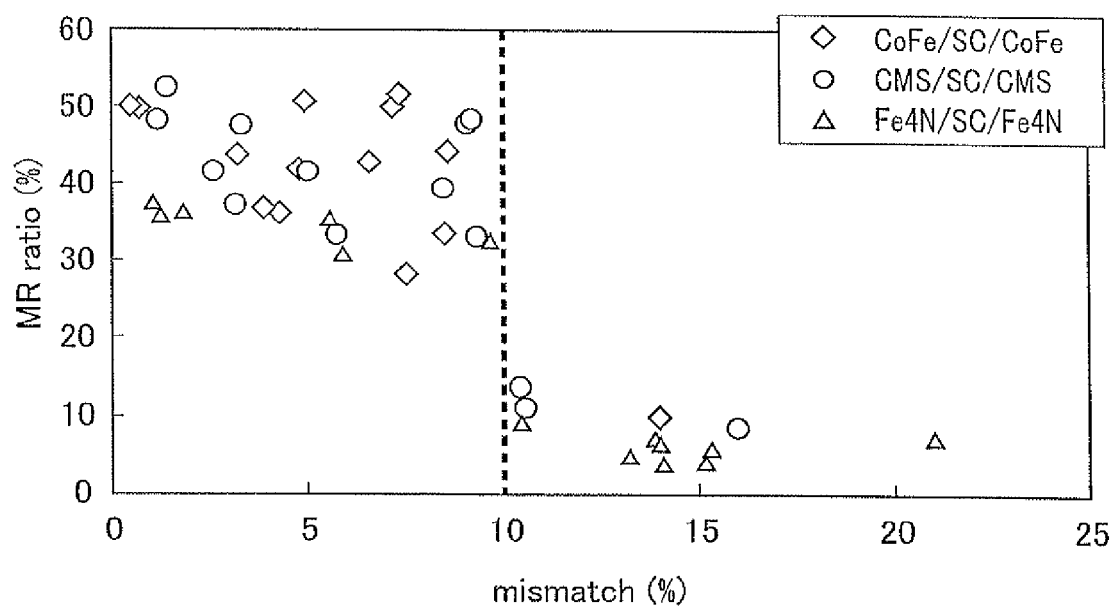
FIG. 8 is a graph of data in Table 3.

When a relationship between a lattice mismatch and an MR ratio shown in Tables 2 and 3 are taken into consideration, if the lattice mismatch is less than 10%, the MR ratio is high and is equal to or over 25%. On the other hand, if the lattice mismatch is equal to or over 10%, the MR ratio is equal to or less than 18%. Data in Table 3 is plotted in FIG. 8. In FIG. 8, CMS represents CoMnSi, and SC represents a semiconductor layer.

In general, a lattice mismatch limit for epitaxial growth is less than 10%. Based on the results of Tables 2 and 3, the lattice mismatch influences a level of epitaxial growth so that it is understood that the lattice mismatch is a factor largely influencing the MR ratio.

Note that it is confirmed that an area resistivity (AR) of elements according to the present invention shown in Table 2 is in a range of 0.1 to 0.3 µl cm.

According to the experimental results above, an effect of the present invention is apparent.

A magnetoresistive effect element (MR element) that is a giant magnetoresistive effect element in a current perpendicular to plane (CPP-GMR) structure includes a spacer layer, a first ferromagnetic layer and a second ferromagnetic layer that are laminated to sandwich the spacer layer, in which a sense current flows along a lamination direction of the first and second ferromagnetic layers. The first ferromagnetic layer is formed before the second ferromagnetic layer is formed, and is located below the second ferromagnetic layer, an angle of magnetization directions of the first ferromagnetic layer and the second ferromagnetic layer relatively change due to an externally applied magnetic field, the spacer layer is configured with a semiconductor layer, and the spacer layer is formed on the first ferromagnetic layer under the condition of the epitaxial growth. Therefore, effect of the present invention is to provide an MR element enabling further improvements of an MR ratio and inhibiting an increase of an AR in order to be able to apply future high density recording.

Possibilities for the industrial use of the present invention include its use in a magnetic disk device with an MR element that detects magnetic field intensity as a signal from a magnetic recording medium, and so on.

What is claimed is:

1. A magnetoresistive effect element (MR element) that is a giant magnetoresistive effect element in a current perpendicular to plane (CPP-GMR) structure, comprising:
    a first ferromagnetic layer;
    a spacer layer that is epitaxially formed on the first ferromagnetic layer;
    a second ferromagnetic layer that is located on the spacer layer, and that is laminated with the first ferromagnetic layer to sandwich the spacer layer, wherein
    a sense current flows along a lamination direction of the first and second ferromagnetic layers,
    angle of magnetization directions of the first ferromagnetic layer and the second ferromagnetic layer relatively change due to an externally applied magnetic field,
    the first ferromagnetic layer and the spacer layer are formed in a (001) orientation,
    a NiFeN orientation under layer having a (001) orientation is formed below the first ferromagnetic layer, the first ferromagnetic layer is epitaxially formed on the NiFeN orientation under layer, and
    the orientation under layer, the first ferromagnetic layer and the spacer layer are adjacently arranged in a bottom-up order.

2. The MR element according to claim 1, wherein a crystal structure of the spacer layer is a cubical crystal.

3. The MR element according to claim 1, wherein a crystal structure of the spacer layer is configured with a zincblende structure or a NaCl type structure (rock salt type structure).

4. The MR element according to claim 1, wherein a lattice mismatch between the first ferromagnetic layer and the spacer layer is less than 10%.

5. The MR element according to claim 1, wherein the first ferromagnetic layer is made of one of CoFe, $Fe_4N$, and a Heusler alloy.

6. The MR element according to claim 1, wherein the second ferromagnetic layer has a (001) orientation, and the second ferromagnetic layer is epitaxially formed on the spacer layer.

7. The MR element according to claim 6, wherein a lattice mismatch between the spacer layer and the second ferromagnetic layer is less than 10%.

8. The MR element according to claim 6, wherein the second ferromagnetic layer is made of one of CoFe, $Fe_4N$, and a Heusler alloy.

9. The MR element according to claim 1, wherein a nonmagnetic layer, which does not obstruct a spin conveyance, is inserted at least one of between the first ferromagnetic layer and the spacer layer and between the second ferromagnetic layer and the spacer layer.

10. A thin film magnetic head comprising:
    an air bearing surface (ABS) that is opposite to a recording medium;
    the magnetoresistive effect element (MR element) according to claim 1 that is provided in the vicinity of the ABS to detect a signal magnetic field from the recording medium; and
    a pair of electrodes that apply an electric current in a lamination direction of the MR element.

11. A head gimbal assembly comprising:
    a slider having the thin film magnetic head according to claim 10 and being provided opposite to a recording medium; and
    a suspension elastically supporting the slider.

12. A magnetic disk device comprising:
    a slider having the thin film magnetic head according to claim 10 and being provided opposite to a recording medium; and
    a positioning device supporting the slider and locating a position of the slider with respect to the recording medium.

13. The MR element according to claim 1, wherein the spacer layer is a semiconductor layer.

* * * * *